United States Patent [19]

Adair

[11] Patent Number: 4,790,408

[45] Date of Patent: Dec. 13, 1988

[54] COILED EXPONENTIAL BASS/MIDRANGE HORN LOUDSPEAKERS

[76] Inventor: John F. Adair, 147 Norwood St., Shreveport, La. 71105

[21] Appl. No.: 148,050

[22] Filed: Jan. 25, 1988

[51] Int. Cl.[4] .................................... H05K 5/00

[52] U.S. Cl. .................................... 181/152; 181/144; 181/155; 181/159; 181/194; 181/199; 381/156

[58] Field of Search ........ 181/144, 145, 148, 151-153, 181/155, 159, 194, 199; 381/156; D14/30

[56] References Cited

U.S. PATENT DOCUMENTS

| | | | |
|---|---|---|---|
| D. 75,617 | 6/1928 | Faison | D14/30 |
| 2,058,132 | 10/1936 | Cirelli | 181/152 |
| 2,310,243 | 2/1943 | Klipsch | 181/152 |
| 2,373,692 | 4/1945 | Klipsch | 181/152 |
| 2,731,101 | 1/1956 | Klipsch | 381/90 X |
| 2,801,703 | 8/1957 | Martin | 181/152 |
| 2,825,419 | 3/1958 | Stephens, Jr. | 181/151 |
| 2,871,972 | 2/1959 | Glassey | 181/152 |
| 3,944,757 | 3/1976 | Tsukamoto | 181/152 X |
| 4,313,032 | 1/1982 | Thomas et al. | 181/152 X |
| 4,549,631 | 10/1985 | Bose | 181/155 |

*Primary Examiner*—B. R. Fuller
*Attorney, Agent, or Firm*—John M. Harrison

[57] ABSTRACT

Coiled Exponential Bass Midrange Horn Loudspeakers which are each characterized by a rigid cabinet of selected size having a sealed air chamber in the base thereof for receiving a low frequency speaker, or driver, and a coiled or convoluted, exponentially flared sound passage extending from the air chamber to the top of the cabinet. In a most preferred embodiment, a high frequency horn is mounted in the cabinet near the open top to extend the audio range of the loudspeaker system. The combination of a low frequency driver and a high frequency horn separated by a continuously exponentially expanding or flared, coiled or convoluted, multi-tapered sound passage chamber eliminates the need for a midrange speaker or horn.

22 Claims, 2 Drawing Sheets

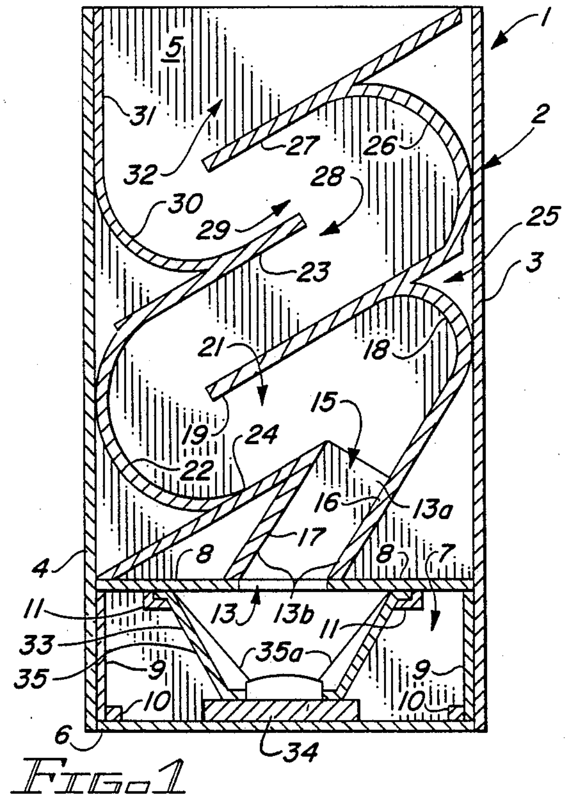
FIG. 1
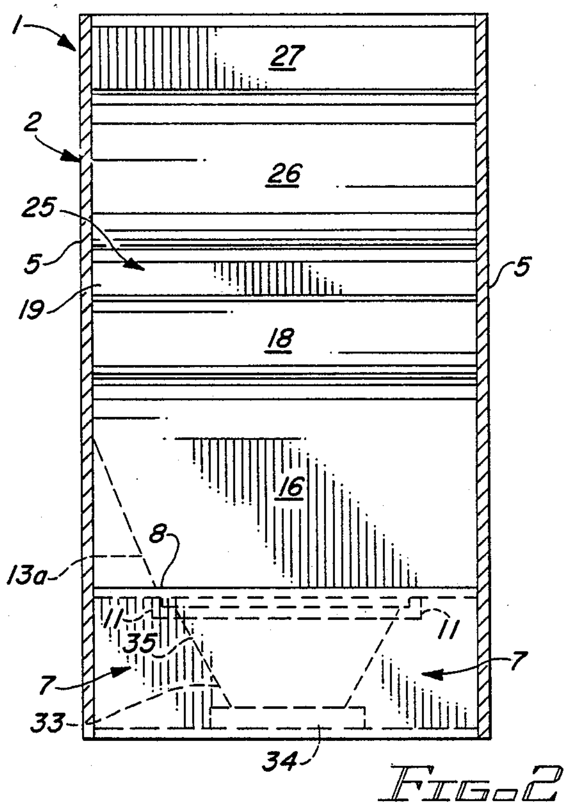
FIG. 2
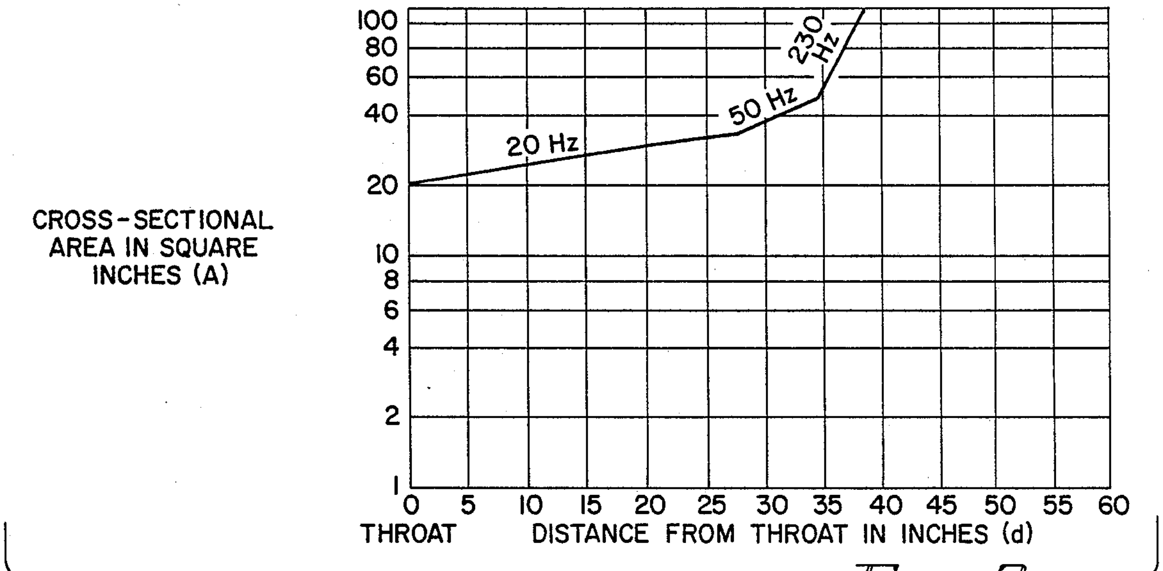
FIG. 3
FIG. 7
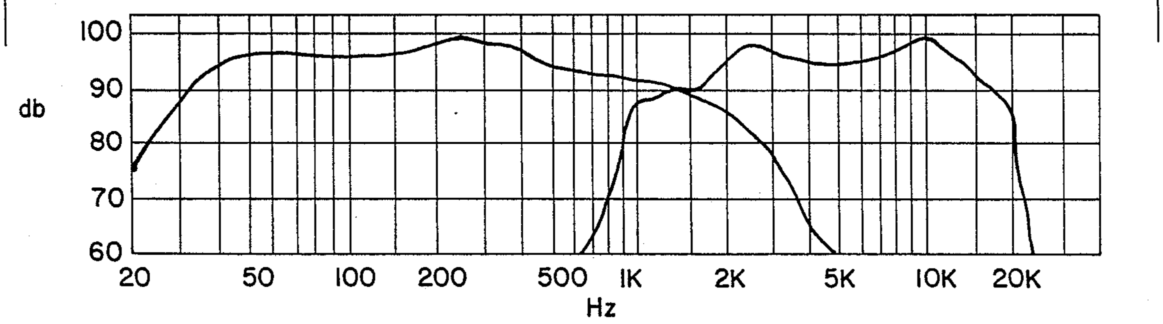

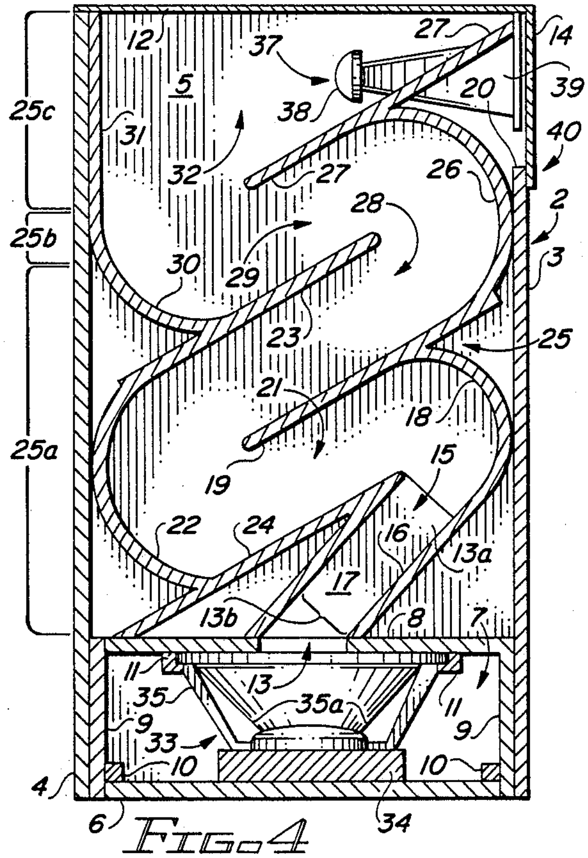
FIG. 4
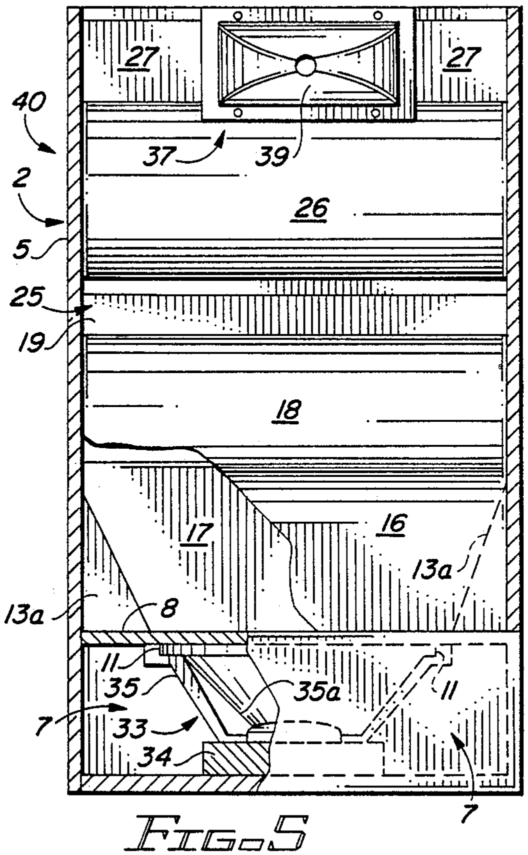
FIG. 5
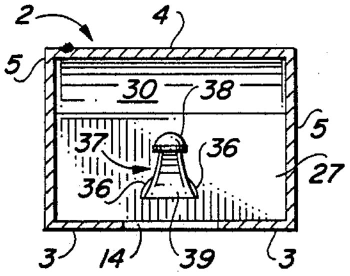
FIG. 6
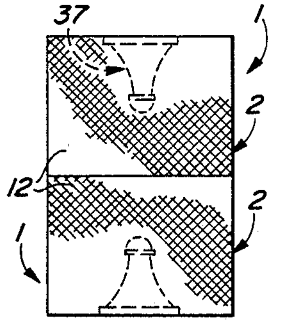
FIG. 8
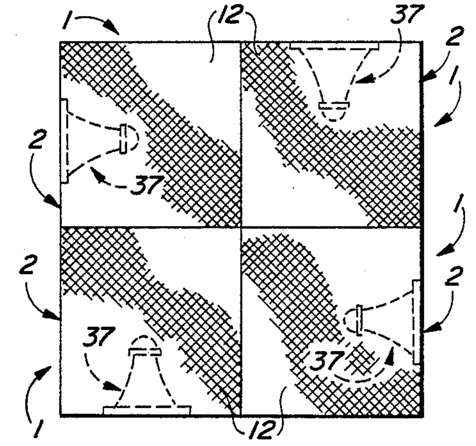
FIG. 9
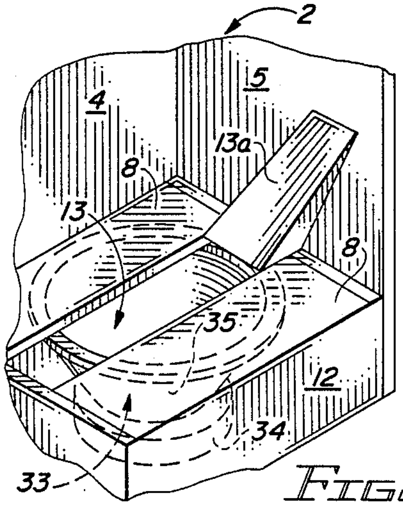
FIG. 12
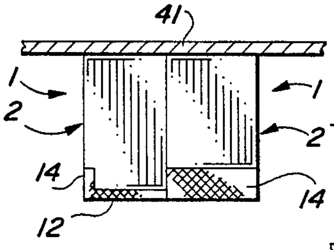
FIG. 10
FIG. 11
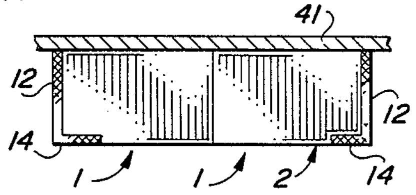

COILED EXPONENTIAL BASS/MIDRANGE HORN LOUDSPEAKERS

BACKGROUND OF THE INVENTION

1. Field of the Invention

This invention relates to a loudspeaker device. More particularly, the present invention relates to "coiled" exponential bass midrange horn loudspeakers which are capable of reproducing a wider range of audio frequencies than prior art folded horns without the phase distortion associated with such horns, in a cabinet that is comparable in size and shape to any conventional direct radiator loudspeaker utilizing a driving unit or driver of similar size.

Low frequency sound waves or bass sounds can be reproduced by a variety of methods; however, only the exponential horn is capable of reproducing bass frequencies with "live" quality. That is to say, only an exponential horn is able to reproduce bass waves with sufficient acoustical power, life-like transient response and without the harmonic distortion normally associated with direct radiator loudspeakers.

In a direct radiator loudspeaker system, bass frequencies are generally reproduced by the movement of a diaphragm mounted within a cabinet or enclosure, with the working side of the diaphragm exposed to the atmosphere. In order for the system to reproduce bass frequencies at an acceptable sound pressure level, the diaphragm or cone must move large volumes of air. In accomplishing this objective, the diaphragm must traverse great distances in a short period of time, but in so doing, induces a great amount of harmonic distortion. The higher the level at which the system is operated, the greater the harmonic distortion realized, and with this distortion comes a significant loss of transient response, the resultant sound waves being of high pressure and low velocity. In contrast, a horn reproduces sound waves with high velocity and very low diaphragm motion, resulting in a high level of transient response and substantial elimination of harmonic distortion. These characteristics afford the system the ability to reproduce sound waves with exacting emulation of the original sound.

2. Description of the Prior Art

Many bass horn loudspeakers are known in the prior art and among the most common are the "folded" variety, some of which are limited to location in the corner of a room for proper operation at bass frequencies. An example of a folded corner horn design is provided in U.S. Pat. No. 2,373,692, dated Apr. 17, 1945, to P. W. Klipsch. Although the acoustical performance of this type of folded horn is superior to a direct radiator-type bass loudspeaker, it lacks a great deal in the ability to effectively reproduce frequencies in the mid-range (approximately 400 to 2,600 Hz.). This problem is a direct result of folding, as the width of the horn at the folds determines the upper limit of the high frequency performance and the sound waves will not traverse a bend if the width of the bend is a half wavelength or more. The folding problem is further complicated by the fact that the horn taper is negative, wherein the flare rate is greater at the throat than at the mouth. Furthermore, the "folding" of a bass horn reduces the overall operational efficiency, as the exponential expansion rate cannot be maintained in the folds or transitions. Most folded bass horns will not effectively reproduce sound above about 500 Hz., thereby necessitating the use of a low upper limit cross-over point to a large mid-range horn.

In a complete folded bass horn loudspeaker system, the midrange horn must be rather large, in order to reproduce sound as low as the upper limit cutoff frequency of the bass horn, or driver. This combination results in a high level of acoustical phase distortion induced upon the electrical audio signal applied to the loudspeaker system, due to physical placement of the horns some distance apart. The problem is further complicated in this type of system by the fact that the larger mid-range horns cannot reproduce the highest frequencies, thus necessitating the use of a third horn and thereby inducing further distortion of the applied audio signal phase. The original audio signal is split electrically and is coupled to each respective speaker horn, resulting in not one, but three sources of sound being projected into the listening area in three different planes. The resultant sound waves from each group of frequencies arrive at the listener's ear out of phase with each other. An example of severe acoustical phase distortion in a folded-type bass horn system is found in U.S. Pat. No. 2,871,972, filed Mar. 12, 1958, to C. Q. Glassey, wherein a single driver is used for driving two horn sections, one from the working side of the driver and the other from the non-working side, resulting in one horn being 180 degrees out of phase with the other.

Another problem with prior art folded bass horn systems is the large size and weight of such units, as compared to conventional direct radiator loudspeaker systems. Although it is accepted that folded bass horn systems are far superior regarding the fidelity of the sound reproduced, when compared with direct radiator loudspeakers, especially in the bass frequency range, they still remain large and costly, which probably accounts for the fact that folded bass horns are the least common of all types of loudspeakers.

A still further problem concerning the size of prior art folded-type bass horns is the fact that due to the large size and structure of these devices, their use as a sound-reproducing unit within a small device such as a portable audio player or television receiver, is not possible. Given the state of the art of modern sound-reproducing equipment such as the digital compact disc player and the digital amplifier, the use of direct radiator loudspeakers as an alternative in connection with such equipment would not be advantageous, as it would circumvent what is gained in the advanced audio technology, by acoustically distorting the audio signal.

Other loudspeaker systems which utilize a folded or baffled configuration include U.S. Pat. No. Des. 75,617, dated June 26, 1928, to H. L. Faison. The Faison loudspeaker includes a folded horn-type speaker of ornamental design. U.S. Pat. No. 2,058,132, dated Oct. 20, 1936, to F. Cirelli, details a "Sound Box for Amplifying Horns with Loudspeakers". The device includes a sound appliance having a sound box, two amplifying horns connected to the sound box and a loudspeaker provided within the midportion of the sound box. Two slender abutting conical portions are provided in the sound box, each of which tapers convergently away from the abutment of the portions at a tapering angle which is less than 45 degrees with respect to the axis of the tapered portion in each of the portions, respectively, the horns being connected to the sound box at the smaller convergent ends thereof. A "Horn for a Loudspeaker" is detailed in U.S. Pat. No. 2,310,243, dated Feb. 9, 1943, to P. W. Klipsch. The horn detailed in this patent includes a multi-baffled loudspeaker designed for mounting in the corner of a room and provided with multiple compartments created by the internal baffles.

U.S. Pat. No. 2,731,101, dated Jan. 17, 1956, also to P. W. Klipsch, details another "Loud Speaker". The loudspeaker detailed in this patent is designed such that the entire horn is formed outside of a housing and the housing itself is characterized by a simple acoustic low pass filter. The housing forms a simple cavity which is unobstructed except for immersion of the driver unit therein. An acoustic inertance, in the form of an orifice or slit suitably formed in the housing, coacts with the cavity to provide the lowpass filter. The front panel of the housing has an opening therein and the driver unit is mounted in the cavity upon the front panel rearwardly of this opening, through which the treble sound radiation leaves the housing. The side panels of the housing extend convergingly rearwardly of the front panel to form, in conjunction with the external proximate surfaces, the horn portions of the speaker. A "Horn for a Loudspeaker" is detailed in U.S. Pat. No. 2,871,972, dated Feb. 3, 1959, to C. Q. Glassey. The Glassey horn includes a hollow housing having an aperture for establishing communication between the interior of the housing and the atmosphere; at least one vibrating diaphragm-type loudspeaker arranged within the housing; a chamber located within the housing and enclosing the speaker and having a first opening for establishment of communication between the rear side of the speaker diaphragm and the interior of the housing; and a second opening for establishing communication between the front side of the speaker diaphragm and the interior of the housing. Further included is a partition arranged within the housing for dividing the aperture into two continguous sections; a first horn substantially encircling the chamber and provided with a flare increasing in at least one dimension from the first opening to the aperture for directing the lower frequencies of the speaker from the first opening to one of the horn mouths; and a second horn having a flare increasing in at least the same dimension as the first horn from the second opening to the aperture, for directing the higher frequency of the speaker from the second opening to the other of the horn mouths, a portion of the first horn being arranged about the second horn with the partition forming a portion common to each of the horns. U.S. Pat. No. 2,801,703, dated Aug. 6, 1957, to D. W. Martin, details a "Diffused-Tone Cabinet for Organs". The device includes a rectangular cabinet having front, rear and end walls; a top and a bottom; a first horn for low frequency sound production occupying a major portion of the enclosure volume of the cabinet and having its front and rear walls defined by the front and rear walls of the cabinet, with the mouth of the first horn opening upwardly at the top of the cabinet, the top being acoustically transparent; and a second horn for high frequency sound production mounted within the cabinet and contained primarily within the body of the first horn, the second horn including a flat horn extending lengthwise of the cabinet and having an elongated slot-like mouth opening upwardly at the top of the cabinet. U.S. Pat. No. 3,944,757, dated Mar. 16, 1976, to Tsukamoto, details a "High Fidelity Moving Coil Loudspeaker". The loudspeaker includes a tubular member having a length longer than the wavelength of any one of the frequencies in a desired frequency range and having a constant cross-sectional area along its entire length. Tubular members are coupled at one end with one side of a vibrating plate or diaphragm through an acoustical transformer constituted by a cavity formed therebetween, wherein the loudspeaker is capable of reproducing sounds with high fidelity, particularly in extremely low frequency ranges. A "Folded Horn Loudspeaker System" is detailed in U.S. Pat. No. 4,313,032, dated Jan. 26, 1982, to Donald W. Thomas, et al. The system includes a rigid enclosure and an integral, exponentially curved horn projecting outwardly from the enclosure toward the listening area. A transducer housed within a sealed chamber interiorly of the enclosure communicates through an aperture into a waveguide system of substantially rectangular dimensions. A baffle-plate system deflects sound energy from the waveguide into the throat of the horn. The baffle-plate system is positioned to avoid the reflection of sound waves back into the waveguide, to thereby minimize distortion. U.S. Pat. No. 4,549,631, dated Oct. 29, 1985, to Amar G. Bose, details a "Multiple Porting Loudspeaker System". The loudspeaker system includes an enclosure of rectangular cross-section, with a baffle dividing the interior into first and second subchambers. Each subchamber is provided with a port tube for coupling the subchamber to the region outside of the enclosure. The dividing baffle carries a woofer.

This invention solves problems associated with prior art folded-type bass horn loudspeaker systems, by providing a "coiled" or convoluted bass and bass/midrange exponential horn loudspeaker system which demonstrates a significantly increased midrange sound output over prior art folded bass horns. The system may also utilize an additional small, high frequency horn oriented in such a manner that the disperson angles of both horns overlap, thereby minimizing acoustical phase distortion in a complete loudspeaker system. The system can be provided in a size and shape which is comparable with common direct radiator loudspeaker systems utilizing a driving unit of similar size.

Accordingly, it is an object of this invention to provide coiled exponential bass horn loudspeakers which exhibit significant midrange sound output, thereby eliminating the necessity for utilizing a large midrange speaker or horn in a complete system.

Another object of this invention is to provide coiled exponential bass and bass/midrange loudspeakers which utilize a miniaturized bass horn or driver in combination with a coiled horn section which is exponentially expanded and carefully convoluted so as not to disturb the cross-sectional configuration.

Yet another object of the invention is to provide coiled exponential bass/midrange horn loudspeakers which, when used in combination with a high frequency speaker or horn of small size placed at the horn mouth, results in a complete loudspeaker system exhibiting a significantly reduced level of acoustical phase distortion.

It is a further object of the invention to provide coiled exponential bass/midrange horn loudspeaker systems of varying dimension, which may employ driving units of any selected size and which are superior in sound quality to conventional loudspeakers.

A still further object of the invention is to provide a coiled exponential bass/midrange horn loudspeaker system, in which the low frequency driving unit and the high frequency horn sections are separated by a selected distance and are connected by an exponentially expanding section or path of varying length and shape, to facilitate placement within another device for reproducing sound within the cabinet of the device.

Yet another object of the invention is to provide a coiled exponential bass/midrange horn located within the cabinet of a selected device for reproducing sound, in which, to facilitate placement within the device, the driver section may be located at some distance from, but connected to the horn mouth by an exponentially expanding section or interconnected sections of varying size and length, which are coiled or tortuously laid out within the cabinet.

Another object of this invention is to provide coiled exponential bass and bass/midrange loudspeaker systems in multiple arrangements, such as side-by-side, back-to-back, bottom-to-bottom, or in other combinations, for use in theaters, auditoriums and the like, for the purpose of increasing the sound pressure level which may be required for servicing such large areas.

SUMMARY OF THE INVENTION

These and other objects of the invention are provided in an exponential bass/midrange horn loudspeaker oriented in the form of a continuous coil or convolution or a series of spiral sound path sections or convolutions expanding exponentially and connected by planar surfaces enclosed in a cabinet of generally rectangular dimension, which loudspeaker is comparable in size and shape to that of a conventional direct radiator loudspeaker utilizing a driver or speaker of comparable size. The "coiled" or convoluted internal cabinet configuration affords a compact structure in which the horn length-to-cabinet height ratio is on the order of 2:1. The exponential horn of this invention is characterized by a cross-sectional area which increases exponentially in size by a certain percentage for each inch of distance from the throat. The cross-sectional area can be therefore expressed by the exponential function: $A = Ao.e^{md}$, where e is Euler's constant (2.718); m is the horn taper in inches; A is the cross-sectional area of the sound path in square inches; d is the distance from the throat; and Ao is the throat area in square inches. Due to the "coil" or convoluted throat design, this formula holds true throughout the entire length of the horn, including the spiral, or convoluted sections. Accordingly, the horn behaves as if it were a straight horn with no folds or bends. The shape of the cross-section area of the horn is of little importance; however, in a preferred embodiment of the invention, a rectangular shape is chosen, in a non-limiting sense. In other embodiments, different cross-sectional area configurations may be employed.

BRIEF DESCRIPTION OF THE DRAWINGS

The invention will be better understood by reference to the accompanying drawings, wherein:

FIG. 1 is a side sectional view of a first preferred embodiment of the coiled exponential bass/midrange horn loudspeaker of this invention which includes a single low frequency driver or speaker;

FIG. 2 is a front sectional view of the coiled exponential bass/midrange horn loudspeaker illustrated in FIG. 1;

FIG. 3 is a graph representing the theoretical low frequency cut-off point of each horn section;

FIG. 4 is a side sectional view of a second preferred embodiment of the coiled exponential bass/midrange horn loudspeaker of this invention, which includes a high frequency horn therein;

FIG. 5 is a front sectional view of the coiled exponential bass/midrange horn loudspeaker illustrated in FIG. 4;

FIG. 6 is a top sectional view of the coiled exponential bass/midrange horn loudspeaker illustrated in FIGS. 4 and 5;

FIG. 7 is a graph plotting the frequency response curve of both the low frequency driver and the high frequency horn provided in the coiled exponential bass/midrange horn loudspeaker illustrated in FIGS. 4–6;

FIG. 8 is a first preferred spacial orientation for a pair of the coiled exponential bass/midrange horn loudspeakers of this invention;

FIG. 9 is a second preferred spacial orientation for four of the coiled exponential bass/midrange horn loudspeakers;

FIG. 10 is a third preferred spacial orientation for a pair of the coiled exponential bass/midrange horn loudspeakers mounted on the ceiling of a structure;

FIG. 11 is a fourth preferred spacial orientation for a pair of the coiled exponential bass/midrange loudspeakers of this invention; and FIG. 12 is a sectional view of a preferred installation for a low frequency driver provided in the base portion of a coiled bass/midrange exponential horn loudspeaker cabinet.

DESCRIPTION OF THE PREFERRED EMBODIMENTS

Referring initially to FIGS. 1, 2 and 12 of the drawings, in a first preferred embodiment of the invention a low frequency coiled bass/midrange exponential horn loudspeaker is generally illustrated by reference numeral 1. The low frequency coiled bass/midrange exponential horn loudspeaker 1 is characterized by a box-like cabinet 2 having a front panel 3, a corresponding parallel rear panel 4, spaced by side panels 5 and closed at the bottom by a bottom panel 6, as illustrated. A sealed air chamber 7 is provided in the lower portion of the cabinet 2 and is defined by an air chamber cover 8, spaced from the bottom panel 6 and fitted with a pair of spaced air chamber sides 9, which extend parallel to, and lie adjacent to the bottom portion of the front panel 3 and the rear panel 4, respectively. A pair of mount blocks 10 are designed to secure the air chamber sides 9 to the bottom panel 6 by means of screws or other fasteners (not illustrated), according to the knowledge of those skilled in the art. A pair of L-shaped speaker mount brackets 11 are secured to the air chamber cover 8 in spaced relationship, in order to engage the top flange of the low frequency driver frame 35 of a low frequency driver 33 and securely mount the low frequency driver 33 in the sealed air chamber 7. When so mounted, the driver cone **35*a* of the low frequency driver 33 faces upwardly toward a loading aperture 13, provided in the air chamber cover 8, with the low frequency magnetic assembly 34 of the low frequency driver 33 lying flat against the inside surface of the bottom panel 6, as illustrated. The length and width of the horn throat 13*b* and the adjacent loading aperture 13 are determined by the width and base length of a pair of aperture wedges 13*a*, which are attached to the side panels 5 and the air chamber cover 8, as illustrated in FIGS. 1 and 12. The spaced speaker mount brackets 11 serve to secure the low frequency driver 33 in the sealed air chamber 7 beneath the horn throat 13*b* and the loading aperture 13. The remainder of the interior of the cabinet 2 defines the sound travel area of the coiled exponential bass/midrange horn loudspeaker 1 system in terms of a tortuous or convoluted path for travel of the sound emitted by the low frequency driver 33. This sound path through the cabinet 2 begins at the horn throat 13*b* and extends into the loading aperture 13, located in a bottom passage 15, which is defined by a frontal bottom passage wall 16 and a companion rear bottom passage wall 17. The bottom passage 15 extends thusly upwardly between the non-parallel aperture wedges 13*a*, which project in forward and upward tapered, angular relationship from a wide base at the loading aperture 13 in the air chamber cover 8, to a narrow edge at the first spiral section 18, as further illustrated in FIGS. 1 and 12. The flat, straight frontal bottom passage wall 16 further defines the curved first spiral section 18 at the top thereof, which first spiral section 18 extends between the side panels 5 and terminates in a flat, straight, rearwardly and downwardly-extending first spiral section wall 19. The opposite, flat and straight rear bottom passage wall 17 extends between the side panels 5, flaring exponentially with respect to the frontal bottom passage wall 16 and terminates at the extending end of a rearwardly disposed rearward passage wall 24. The rearward passage wall 24 is spaced from the first spiral section wall 19 and in combination with the first spiral section wall 19 and the side panels 5, defines an exponentially flared first rearward passage 21, which communicates in convoluted fashion with the bottom passage 15. The rearward passage wall 24 receives one end of a curved second spiral section 22, which in turn, extends between the side panels 5 and terminates in a flat, straight second spiral section wall 23, that extends forwardly and upwardly inside the cabinet 2 between the side panels 5. The second spiral section wall 23 is spaced from the first spiral section wall 19 exponentially flared relationship to define a first forward passage 28 extending between the parallel side panels 5 and located immediately above, and communicating with, the first rearward passage 21 and separated therefrom by the first spiral section wall 19, as illustrated in FIG. 1. The first spiral section wall 19 terminates at one end in a curved, third spiral section 26 which extends between the side panels 5 and terminates rearwardly in a flat and straight third spiral section wall 27, which also extends between the side panels 5. The second spiral section wall 23 is spaced from the third spiral section wall 27 between the side panels 5 in an exponentially flared configuration to define a second rearward passage 29, which communicates with the adjacent first forward passage 28. A fourth spiral section 30 extends between the side panels 5 and joins a fourth spiral section wall 31, projecting parallel to and lying adjacent the rear panel 4 and the second spiral section wall 23. An outlet chamber 32 is defined by the third spiral section wall 27, the fourth spiral section wall 31 and the parallel side panels 5**, respectively.

Referring now to FIGS. 4–6 of the drawings, a low and high frequency coiled exponential bass/midrange horn loudspeaker 40 is illustrated, and it will be appreciated that the cabinet 2 and the coiled, tortuous or convoluted sound path structure and configuration provided inside the cabinet 2 are the same for both the low frequency coiled exponential bass/midrange horn loudspeaker 1 illustrated in FIGS. 1 and 2, and the low and high frequency coiled bass/midrange exponential loudspeaker 40, illustrated in FIGS. 4 and 5. However, in the low and high frequency coiled exponential bass/midrange loudspeaker 40, a high frequency horn 37 is provided in the top portion of the cabinet 2, with the horn component 39 of the high frequency horn 37 extending through a slot 36, provided in the forward portion of the third spiral section wall 27, as illustrated in FIG. 6. The high frequency driving unit 38 projects from the base of the high frequency horn 39 component into the outlet chamber 32, as illustrated in FIG. 4. The forward portion of the horn component 39 of the high frequency horn 37 extends into a front panel opening 20, provided in the front panel 3 of the cabinet 2 and a segment of side grill cloth 14 extends over the front panel opening 20, in order to obscure the horn component 39 and impart a finished appearance to the cabinet 2. Furthermore, in a most preferred embodiment of the invention, a top grill cloth 12 extends over the top of the cabinet 2, in order to further finish the cabinet 2.

It will be appreciated from a consideration of the above that the sound path in both the low frequency coiled exponential bass/midrange horn loudspeaker 1, illustrated in FIGS. 1 and 2, and the low and high frequency coiled exponential bass/midrange horn loudspeaker 40, illustrated in FIGS. 4–6, can be isolated into 3 exponential sound passage chamber sections; a top section **25*a*, a middle section 25*b* and a bottom section 25*c*, in the sound passage chamber 25. Each of the delineated sections is characterized by a significantly different low frequency cut-off point, such that the sound passage chamber 25 of the low frequency coiled exponential bass/midrange horn loudspeaker 1 and the low and high frequency coiled exponential bass/midrange horn loudspeaker 40 are characterized by a positive taper. The term "positive taper" refers to the fact that the cross-sectional area of the bottom passage 15, first rearward passage 21, first forward passage 28, second rearward passage 29 and the outlet chamber 32 continuously expand in a positive, exponential manner, with the fastest taper located at the outlet chamber 32 and the slowest taper provided in the bottom passage 15 at the loading aperture 13. The major portion, or bottom section 25*c* of the low frequency coiled exponential bass/midrange horn loudspeaker 1 includes about 70% of the total length of the sound passage chamber 25 and has a theoretical low frequency cut-off point of 20 Hz, as defined by the frequency graph illustrated in FIG. 3. The frequency graph represents the theoretical low frequency cut-off point of each horn section and is set by the taper factor according to the formula: $fc = mc/4Pi$, where m is the horn taper factor expressed in inverse inches, fc is the theoretical cut-off frequency expressed in Hz, c is the speed of sound (13,575 in/sec.), and 4Pi is a constant (12.57) and represents the cross-sectional area in square inches for each horn section at any given distance along the sound passage chamber 25 from the horn throat 13*b*. The bottom section 25*c* of the sound passage chamber 25 is coupled to the intermediate zone, or middle section 25*b*, which includes about 18% of the sound travel length at the 58 Hz level, as noted on the frequency graph in FIG. 3. The third zone, or top section 25*a*, includes an output section which has a low frequency cut-off of about 230 Hz, as further defined in FIG. 3, and includes the remaining 12% of the total length of the sound passage chamber 25**.

The use of a multiple, positive taper arrangement in the exponential coiled bass/midrange horns of this invention affords several advantages over prior art folded bass horns. First of all, the efficiency is increased at both the upper and lower frequency limits of the unit, resulting in a smooth response throughout the entire range of the horn. Secondly, a much smaller low frequency driver may be used with the coiled exponential bass/midrange horn loudspeaker, thereby permitting a substantial reduction in the overall size of the horn. In reducing the size of a bass horn or driver, the greatest problem to be overcome is that of negative reactance presented the driver at or near the low frequency cut-off point of the horn. In the coiled exponential bass/midrange horn loudspeakers of this invention, this factor is offset to a substantial degree by employing four techniques in addition to the multiple positive taper: first of all, and referring again to FIGS. 1 and 2 of the drawings, in a most preferred embodiment of the invention, the low frequency driver 33 is positioned in the sealed air chamber 7 with the low frequency driver cone 35*a* located adjacent a loading aperture 13 which is characterized by a cross-sectional area that is approximately 50% larger than the cross-sectional area of the horn throat 13*b*. This factor adds compression, which compression increases positive reactance, the positive reactance serving to partially offset the negative reactance presented to the low frequency driver 33 by the air load of the atmosphere at and near the low frequency cut-off point of the low frequency coiled exponential bass/midrange horn loudspeaker 1. Secondly, the volume of the sealed air chamber 7 on the non-working side of the low frequency driver 33 is substantially reduced, a factor which further increases positive reactance. Thirdly, the stiffness or mechanical resistance of the low frequency driver cone 35*a* is increased. Fourthly, the low frequency driver 33 chosen for a significantly small low frequency coiled exponential bass/midrange horn loudspeaker 1 must have a substantial magnetic structure comparable to that of a larger driver and should have a minimum magnetic flux density of about 9000 gauss.

Given the increased efficiency at the upper and lower theoretical cut-off points and using the multiple positive taper configuration of the sound passage chamber 25 in the cabinet 2 of both the low frequency coiled exponential bass/midrange horn loudspeaker 1 and the low and high frequency coiled exponential bass/midrange horn loudspeaker 40, and further in conjunction with the techniques used to offset low frequency negative reactance in the system, it is possible to produce a coiled exponential bass/midrange horn loudspeaker configuration utilizing the smallest of low frequency drivers 33, with effective results. The systems of this invention are characterized by the outstanding quality and distortion-free sound of an exponential bass horn, in virtually any location and configuration in which a direct radiator loudspeaker might be employed. The system can be arranged, for example, within the cabinet of a television receiver or a portable audio unit, as hereinafter further described. The coiled exponential bass/midrange horn loudspeaker systems of this invention can also replace common public address type horns currently in use, as this type of horn is not characterized by high fidelity and has no low frequency output. These horns are further totally unsuitable for reproduction of sound from musical instruments.

The smallest low frequency coiled exponential bass/midrange horn loudspeaker 1 and low and high frequency coiled exponential bass/midrange horn loudspeaker 40 which have been built and tested to date each utilize a low frequency driver 33 having a frame diameter of 4 inches and a driver cone 35*a* with a diameter of 3.25 inches and a low frequency magnetic assembly 34 of 9000 gauss magnetic flux density. The low frequency driver 33 was located within a cabinet 2 measuring 12 inches in height, 9 inches in width and 5.75 inches in depth and reproduced base frequencies in the low 30 HZ and mid-range frequencies to above 2000 Hz.

The size and shape chosen for the preferred embodiments of the invention set forth in the drawings demonstrates the ability of the low frequency coiled exponential bass/midrange horn loudspeaker 1 and the low and high frequency coiled exponential bass/midrange horn loudspeaker 40 to reproduce low base frequencies from a cabinet 2 of relatively small size. However, it will be appreciated by those skilled in the art that it is possible to produce a low frequency coiled exponential bass/midrange horn loudspeaker 1 and a low and high frequency coiled exponential bass/midrange horn loudspeaker 40 of substantially any desired size. For example, a miniature low frequency coiled exponential bass/-midrange horn loudspeaker 1 or low and high frequency coiled bass/midrange exponential horn loudspeaker 40 can be constructed utilizing a low frequency driver 33 as small as 4 inches in diameter. Alternatively, a much larger low frequency coiled exponential bass/-midrange horn loudspeaker 1 can be developed for a subwoofer system, such as those used in theaters or auditoriums, utilizing a low frequency driver 33 having a selected diameter.

Referring again to the drawings, a low frequency driver 33 having a diameter of 8 inches is typically used in the cabinet 2 of both the low frequency coiled exponential bass/midrange horn loudspeaker 1 and the low and high frequency coiled exponential bass/midrange horn loudspeaker 40. This low frequency driver 33 is characterized by a low frequency magnetic assembly 34 with a magnetic flux density of 9,500 gauss. Since the diameter of the low frequency driver 33 will determine the cross-sectional area of the horn throat 13*b* in the cabinet 2, which cross-sectional area determines the dimensions of the remaining coiled sound passage chamber 25 of the cabinet 2, the cross-sectional area of the horn throat 13*b* is determined by the formula $A_t = Fr^2 \, Pi/2$, where $A_t$ is the throat area in square inches, Fr is the radius of the driver frame and pi is a constant, 3.1416.

The length of the sound travel path through the sound passage chamber 25 in the low frequency coiled exponential bass/midrange horn loudspeaker 1 and the low and high frequency coiled exponential bass/midrange horn loudspeaker 40 is determined by the desired dimensions of the enclosure or cabinet 2. In a preferred embodiment of the invention, the length of this path of sound travel to the cabinet height ratio is approximately 2:1. The size of the sealed air chamber 7 will affect the size of the cabinet 2 to some degree and the sealed air chamber 7 may vary in size, depending upon the stiffness of the low frequency driver cone 35*a* and the free air resonance. In the embodiment of the invention illustrated in FIGS. 1, 2, 4 and 5, a cabinet 2 height of 22 inches, a width of 13 inches and a depth of 10 inches was chosen. Furthermore, the volume of the sealed air chamber 7 is determined by the formula $V = T_a \, L/2$, where V is the volume of the sealed air chamber 7 in cubic inches, $T_a$ is the throat area in square inches and L is the length of the low frequency section of the cabinet 2. The formula facilitates calculation of the air volume for any particular low frequency driver 33 utilized in this embodiment of the invention. However, if a different low frequency driver 33 is utilized in the cabinet 2, the air volume of the sealed chamber 7 may be adjusted slightly, depending upon the characteristics of the low frequency driver 33 chosen.

Referring again to FIGS. 4–6 of the drawings, in a most preferred embodiment of the invention the high frequency horn 37 is added to the cabinet 2 in combination with the low frequency driver 33, in order to extend the audio range of the system toward the upper limit of the audio spectrum. Considering the high midrange output of the low and high frequency coiled exponential bass midrange horn loudspeaker 40 as illustrated in FIGS. 4 and 5, the necessity for a large midrange horn in the cabinet 2 is eliminated. Accordingly, the addition of the high frequency horn 37 to the cabinet 2 in the low frequency coiled exponential bass/midrange horn loudspeaker 1 illustrated in FIGS. 1 and 2, completes the low and high frequency coiled exponential bass/midrange horn loudspeaker 40 illustrated in FIGS. 4 and 5 and eliminates the necessity of providing a mid-range horn herein. In a most preferred embodiment of the invention, the high frequency horn 37 is installed in the outlet chamber 32 of the cabinet 2 in the slot 36 provided in the third spiral section wall 27, as heretofore described. By locating the high frequency horn 37 in this position inside the cabinet 2, the dispersion angles of both the high frequency horn 37 and the low frequency driver 33 overlap each other, forming a common axis for both speakers. Accordingly, the combination results in a smooth frequency response curve as illustrated in FIG. 7, with a smooth transition point for crossover, coupled with the common axis. All frequencies reproduced by the low frequency driver 33 and the high frequency horn 37 appear to originate from a single source, the result being a loudspeaker system which exhibits a substantially reduced level of acoustical phase distortion as compared to both prior art horn and direct radiator loudspeaker systems.

The convoluted or coiled configuration of the sound travel path in the sound passage chamber 25 of the low frequency coiled exponential bass/midrange loudspeaker 1 and the low and high frequency coiled exponential bass/midrange horn loudspeaker 40 further permits maximum utilization of space within each cabinet 2. However, it will be understood by those skilled in the art that the coiled and convoluted configuration of the sound passage chamber 25, illustrated in the cabinets 2 in FIGS. 1, 2, 4 and 5, respectively, may also be used as the sound reproducer within the cabinet of other host devices, such as a television receiver. Under such circumstances, it may be desirable to separate the sealed air chamber 7 from the convoluted and coiled sound passage chamber 25, such that the two units can then be connected with an additional exponentially expanded section of varying length and shape to facilitate placement conveniently within the host device. The separation can be particularly advantageous when the embodiment of this invention is used in conjunction with a television receiver, as the cathode ray tube is extremely sensitive to stray magnetic fields. The low frequency driver 33 may therefore be located well away from the cathode ray tube and the exponentially developed sound passage chamber 25, thereby increasing the length of the sound passage chamber 25 and raising the level of efficiency of the system, as well as minimizing magnetic interference.

For commercial applications such as in theaters and auditoriums, it may be necessary to provide the low frequency coiled exponential bass/midrange horn loudspeaker 1 and the low and high frequency coiled exponential bass/midrange horn loudspeaker 40 in pairs or groups of pairs, to increase the acoustical power level in these large areas. Considering the point of discharge at the top grill cloth 12 and, in the case of the low and high frequency coiled exponential bass/midrange horn loudspeaker 1, the side grill cloth 14, placement of the cabinets 2 in a side-by-side and back-to-back arrangement affords a practical spatial arrangement for increasing acoustical power level output, as illustrated in FIGS. 8 and 9 of the drawings. Furthermore, both the low frequency coiled exponential bass/midrange horn loudspeaker 1 and the low and the high frequency coiled exponential bass/midrange loudspeaker 40 may be suspended from a ceiling 41 in the configurations illustrated in FIGS. 10 and 11, as desired, for servicing large areas such as an arena, auditorium or domed stadium, and similar locations. Referring again to FIGS. 4 and 5 of the drawings, the horn component 39 of the high frequency horn 37 can be oriented adjacent to either of the side panels 5 or the rear panel 4, or anywhere in the outlet chamber 32, as desired, the position noted in the drawings being illustrative only.

It will be appreciated that the particular dimensions incorporated in the cabinet 2 of the low frequency coiled exponential bass/midrange horn loudspeaker 1 and the low and high frequency coiled exponential bass/midrange horn loudspeaker 40 of this invention are for illustrative purposes only and in no way limit the scope of the invention. The coiled or convoluted design and length of the exponentially flared sound passage chamber 25 in the respective cabinets 2 affords an extremely efficient and rigid structure created by multiple baffled surfaces within the cabinet 2, which baffled surfaces define the sound passage chamber 25. This exponentially expanding sound passage chamber 25 results in a cancellation of cabinet resonances, which facilitates the use of lighter materials with a more complete air tightness, all of which are essential for proper and efficient operation of the coiled exponential horn loudspeakers detailed herein. It is further understood that the sound passage chamber 25 can be constructed of any desired material according to the knowledge of those skilled in the art. For example, the sound passage chamber 25 can be constructed of suitable plastic materials such as polyethylene and polypropylene, in non-exclusive particular, by well known injection-molding techniques and installed in a cabinet of desired dimensions and design.

Accordingly, while the preferred embodiments of the invention have been described above, it will be recognized and understood that various modifications may be made therein and the appended claims are intended to cover all such modifications which may fall within the spirit and scope of the invention.

Having described my invention with the particularity set forth above, what is claimed is:

1. A coiled exponential bass/midrange horn loudspeaker comprising enclosure means having an open top, said enclosure means adapted for mounting in a selected location for use as a loudspeaker; flared sound chamber means provided in said enclosure means in convoluted relationship, said flared sound chamber means defining an exponentially expanding sound passage inside said enclosure means; a substantially sealed air chamber provided in said enclosure means and an aperture provided in said air chamber, said aperture communicating with said flared sound chamber means; and low frequency driver means provided in said air chamber adjacent to said aperture, for generating sound and projecting the sound through said flared sound chamber means and from said open top of said enclosure means.

2. The coiled exponential bass/midrange horn loudspeaker of claim 1 further comprising high frequency horn means located in said enclosure means adjacent to said open top, said high frequency horn means oriented in communication with said flared sound chamber means.

3. The coiled exponential bass/midrange horn loudspeaker of claim 1 wherein said flared sound chamber means further comprises a plurality of connected, individually flared sound chambers, with the first one of said flared sound chambers located adjacent to said aperture and said low frequency driver means and the last one of said flared sound chambers communicating with said open top.

4. The coiled exponential bass/midrange horn loudspeaker of claim 3 further comprising high frequency horn means mounted in said last one of said flared sound chambers in said enclosure means adjacent to said open top.

5. The coiled exponential bass/midrange horn loudspeaker of claim 1 wherein said enclosure means further comprises a rigid cabinet having a bottom panel, a front panel and a rear panel upward-standing from said bottom panel in substantially parallel relationship and a pair of side panels upward-standing from said bottom panel in substantially parallel relationship, said side panels attached to said front panel and said rear panel, with the top edges of said front panel, said rear panel and said side panels terminating in a common plane to define said open top of said cabinet.

6. The coiled exponential bass/midrange horn loudspeaker of claim 5 further comprising a slot provided in said front panel adjacent to said open top and high frequency horn means mounted in said slot in communication with said flared sound chamber means.

7. The coiled exponential bass/midrange horn loudspeaker of claim 6 wherein said flared sound chamber means further comprises a plurality of connected, individually flared sound chambers, with the first one of said flared sound chambers located adjacent to said aperture and said low frequency driver means and the last one of said sound chambers communicating with said high frequency horn means and said open top.

8. The coiled exponential bass/midrange horn loudspeaker of claim 1 further comprising sound-penetrating top cover means covering said open top.

9. The coiled exponential bass/midrange horn loudspeaker of claim 8 further comprising a slot provided in said front panel adjacent to said open top, high frequency horn means mounted in said slot in communication with said flared sound chamber means and sound-penetrating front cover means covering said slot.

10. The coiled exponential bass/midrange horn loudspeaker of claim 9 wherein said flared sound chamber means further comprises a plurality of connected, individually flared sound chambers, with the first one of said flared sound chambers located adjacent to said aperture and said low frequency driver means and the last one of said sound chambers communicating with said high frequency horn means and said open top.

11. A coiled exponential bass/midrange horn loudspeaker comprising enclosure means having a bottom panel, side panels upward-standing from said bottom panel in spaced relationship, a front panel upward-standing from said bottom panel for closing one side of said side panels and a rear panel upward-standing from said bottom panel for closing the opposite side of said side panels and defining an open top; a flared sound chamber provided in said enclosure means, said flared sound chamber disposed between said side panels and extending through said enclosure means in convoluted, stacked, exponentially expanding relationship; a substantially sealed air chamber provided in said enclosure means adjacent to said bottom panel and a loading aperture provided in said air chamber, said air chamber communicating with the bottom end of said flared sound chamber through said loading aperture; and low frequency driver means mounted in said air chamber adjacent to said loading aperture, for generating sound and projecting the sound through said loading aperture and said flared sound chamber and from said open top of said enclosure means.

12. The coiled exponential bass/midrange horn loudspeaker of claim 11 further comprising high frequency horn means located in said enclosure means adjacent to said open top, said high frequency horn means oriented in communication with said flared sound chamber.

13. The coiled exponential bass/midrange horn loudspeaker of claim 11 wherein said flared sound chamber further comprises a plurality of connected, individually flared sound chambers, with the first one of said flared sound chambers located adjacent to said loading aperture and said low frequency driver means and the last one of said flared sound chambers communicating with said open top.

14. The coiled exponential bass/midrange horn loudspeaker of claim 13 further comprising high frequency horn means located in said last one of said flared sound chambers in said enclosure means adjacent to said open top.

15. The coiled exponential bass/midrange horn loudspeaker of claim 11 further comprising a slot provided in said front panel adjacent to said open top and high frequency horn means mounted in said slot in communication with said flared sound chamber.

16. The coiled exponential bass/midrange horn loudspeaker of claim 11 wherein said flared sound chamber further comprises a plurality of connected, individually flared sound chambers, with the first one of said flared sound chambers located adjacent to said loading aperture and said low frequency driver means and the last one of said flared sound chambers communicating with said open top, and further comprising:

(a) a slot provided in said front panel adjacent to said open top and high frequency horn means mounted in said slot in communication with said last one of said flared sound chambers;
(b) a sound-penetrating top cover means covering said open top; and
(c) a sound-penetrating front cover means covering said slot.

17. A coiled exponential bass/midrange horn loudspeaker comprising an enclosure having a bottom panel, side panels upward-standing from said bottom panel in spaced relationship, a front panel upward-standing from said bottom panel for closing one side of said side panels and a rear panel upward-standing from said bottom panel for closing the opposite side of said side panels and defining an open top; a flared sound chamber provided in said enclosure with said side panels defining opposite walls of said flared sound chamber and said flared sound chamber arranged in convoluted, stacked relationship and extending through said enclosure in exponentially expanding relationship; a substantially sealed air chamber provided in said enclosure adjacent to said bottom panel and a loading aperture provided in said air chamber, said air chamber communicating with the bottom end of said flared sound chamber through said loading aperture; and a low frequency driver mounted in said air chamber adjacent to said loading aperture, for generating sound and projecting the sound through said loading aperture and said flared sound chamber and from said open top of said enclosure.

18. The coiled exponential bass/midrange horn loudspeaker of claim 17 further comprising a pair of aperture wedges tapering from said side panels to said aperture in spaced relationship for defining the length of said aperture.

19. The coiled exponential bass/midrange horn loudspeaker of claim 17 further comprising a slot provided in said front panel adjacent to said open top and a high frequency horn means mounted in said slot in communication with said flared sound chamber.

20. The coiled exponential bass/midrange horn loudspeaker of claim 17 further comprising:

(a) a slot provided in said front panel adjacent to said open top and a high frequency horn mounted in said slot in communication with said flared sound chamber; and (b) a pair of aperture wedges tapering from said side panels to said aperture in spaced relationship for defining the length of said aperture.

21. The coiled exponential bass/midrange horn loudspeaker of claim 20 further comprising a sound-penetrating top cover covering said open top of said enclosure and a sound-penetrating front cover covering said slot in said front panel.

22. The coiled exponential bass/midrange horn loudspeaker of claim 21 wherein said flared sound chamber further comprises a plurality of connected, individually flared sound chambers, with the first one of said flared sound chambers located adjacent to said loading aperture and said low frequency driver and the last one of said flared sound chambers communicating with said high frequency horn and said open top.

* * * * *